United States Patent [19]

Lachmann

[11] Patent Number: 5,003,363
[45] Date of Patent: Mar. 26, 1991

[54] CIRCUIT ARRANGEMENT AND APPARATUS FOR NON-CONTACTING REFERENCE VALUE PRESCRIPTION FOR AN INTEGRATED CIRCUIT ENVELOPED WITHIN NON-MAGNETIC MATERIAL

[75] Inventor: Ulrich Lachmann, Munich, Fed. Rep. of Germany

[73] Assignee: Siemens Aktiengesellschaft, Berlin and Munich, Fed. Rep. of Germany

[21] Appl. No.: 472,654

[22] Filed: Jan. 30, 1990

[30] Foreign Application Priority Data

Mar. 17, 1989 [DE] Fed. Rep. of Germany ....... 3908892

[51] Int. Cl.$^5$ .............................................. H01L 27/22
[52] U.S. Cl. ........................................ 357/27; 357/74; 357/75; 338/32 H; 338/32 R
[58] Field of Search ............................. 357/27, 74, 75; 338/32 R, 32 H

[56] References Cited

U.S. PATENT DOCUMENTS

| 3,742,243 | 6/1973 | Gamble | 324/174 |
| 3,858,145 | 12/1974 | Sulich et al. | 338/32 H |
| 4,086,533 | 4/1978 | Ricouard et al. | 338/32 H |
| 4,188,605 | 2/1980 | Stout | 357/27 |
| 4,295,118 | 10/1981 | Herr et al. | 338/32 H |
| 4,953,002 | 8/1990 | Nelson et al. | 357/27 |

Primary Examiner—Rolf Hille
Assistant Examiner—Tan Ho
Attorney, Agent, or Firm—Hill, Van Santen, Steadman & Simpson

[57] ABSTRACT

An integrated circuit is encased in non-magnetic material and electrically connected to a Hall sensor. A permanent magnet is mounted for movement with respect to the Hall sensor to cause the Hall sensor to produce an output signal for setting a reference value.

6 Claims, 1 Drawing Sheet

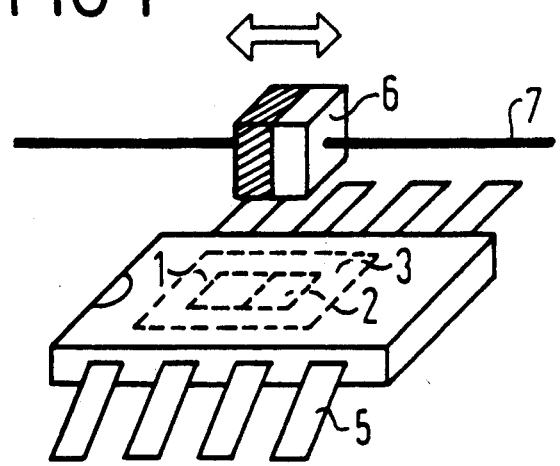
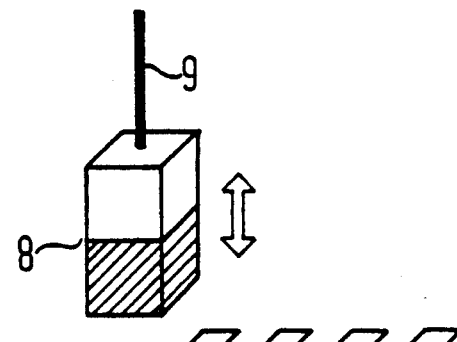
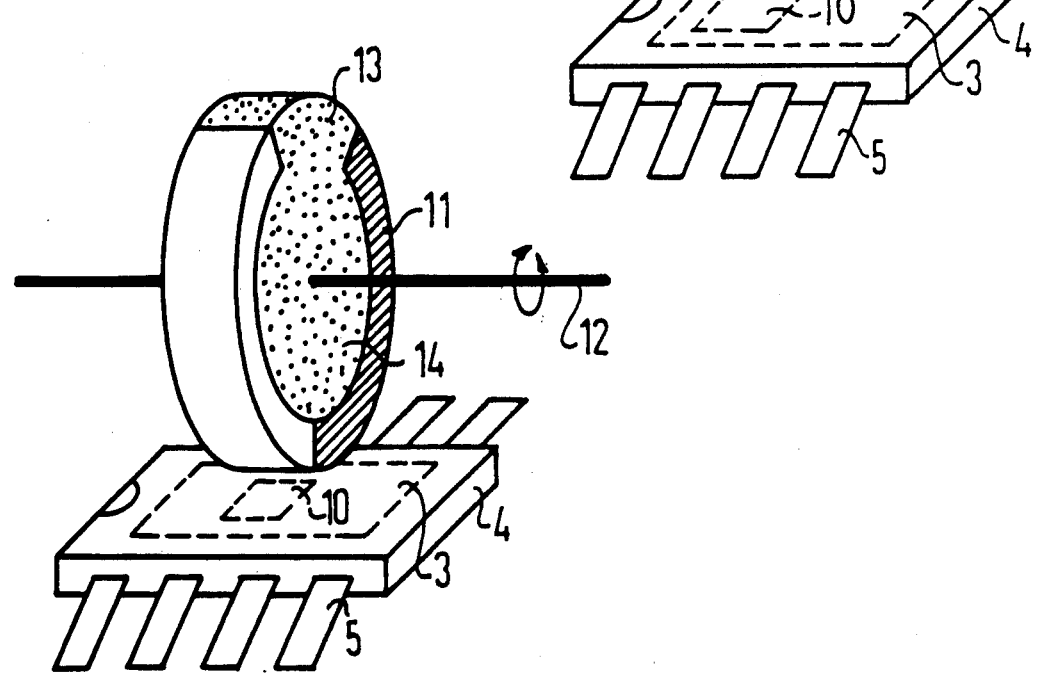

CIRCUIT ARRANGEMENT AND APPARATUS FOR NON-CONTACTING REFERENCE VALUE PRESCRIPTION FOR AN INTEGRATED CIRCUIT ENVELOPED WITHIN NON-MAGNETIC MATERIAL

BACKGROUND OF THE INVENTION

1. Field of the Invention

The present invention relates to a circuit arrangement and to an apparatus for non-contacting reference value prescription for an integrated circuit, which includes at least one Hall sensor enveloped with the integrated circuit within non-magnetic material.

2. Description of the Prior Art

Numerous integrated circuits are known in the art for which operationally-important reference values are prescribed by way of external, line-bound actuation elements. Potentiometers which enable a well-manipulatable and accurate setting of the reference value are preferably employed as external actuation elements. The standard utilizations of potentiometers, in combination with integrated circuits, for example, are volume controls in low-frequency amplifiers, actual value potentiometers in follow-up circuits or setting potentiometers in dimmer circuits.

Included within the disadvantages given the utilization of potentiometers, are the requirement of additional terminals for the integrated circuit as well as mechanical wear of the potentiometers due to abrasion of the wiper and of the resistance track. Further, the reliability of the potentiometers is greatly reduced under unfavorable operating conditions, for example due to moisture, dust or mechanical actions, for example given operation in a motor vehicle. Only involved special formats were capable of alleviating the situation up to now.

SUMMARY OF THE INVENTION

It is an object of the invention to provide a circuit arrangement and an apparatus for reference value prescription for an integrated circuit having low susceptibility to disturbance given reduced expense.

In a circuit arrangement and apparatus of the type generally set forth above, the above object is achieved according to the present invention in a circuit arrangement which is particularly characterized by Hall sensors which are co-integrated in the integrated circuit and in communication with other parts of the integrated circuit, as well as by a movable permanent magnet acting on the Hall sensor or sensors.

According to another feature of the invention the circuit arrangement and apparatus are particularly characterized in that the distance of the permanent magnet from the Hall sensor is variable.

According to another feature of the invention, the circuit arrangement and apparatus are particularly characterized in that a rotatable, annular permanent magnet with a non-magnetic gap is provided.

According to another feature of the invention, the arrangement and apparatus are particularly characterized in that a plurality of Hall sensors are co-integrated in the integrated circuit.

An advantage of the invention is that Hall sensors can be co-integrated in a given integrated circuit during manufacture without auxiliary steps. In addition to this, no additional terminals for external actuation elements are required. The actuation element provided in accordance with the invention, namely a permanent magnet, can also be manufactured with little expense, and, moreover, is not electrically connected to the integrated circuit, this making contacting difficulties at the actuation element impossible and making it possible to achieve a high electrical insulation in combination with the envelope. The influence of dust, moisture and mechanical shocks is thereby also kept low.

BRIEF DESCRIPTION OF THE DRAWINGS

Other objects, features and advantages of the invention, its organization, construction and operation will be best understood from the following detailed description, taken in conjunction with the accompanying drawing, on which:

FIG. 1 is a perspective view of a first exemplary embodiment of a circuit arrangement and apparatus constructed in accordance with the invention and comprising two Hall sensors and a permanent magnet displaceable parallel thereto;

FIG. 2 is a perspective view of a second exemplary embodiment of a circuit arrangement and an apparatus constructed in accordance with the invention and comprising a Hall sensor and a permanent magnet displaceable perpendicular to the sensor surface; and FIG. 3 is a perspective view of a third exemplary embodiment constructed in accordance with the invention and comprising a Hall sensor and an annular permanent magnet.

DESCRIPTION OF THE PREFERRED EMBODIMENTS

Referring to FIG. 1, two Hall sensors 1 and 2 are co-integrated in an integrated circuit 3 in immediate proximity of one another in the exemplary embodiment of FIG. 1. The integrated circuit 3 with the Hall sensors 1 and 2 at the connections 15 is completely enveloped with non-magnetic material 4, for example plastic, and comprises terminals 5 as external contacts. A permanent magnet 6 on an axis 7 is arranged parallel to the sensor surface above the integrated circuit 3 such that the permanent magnet 6 can be moved past the two Hall sensors 1 and 2. Depending on the application, the permanent magnet 6 can be rigidly joined to the axis 7 or can be displaceable on the axis 7. The strength and the polarity of the incident magnetic field differs given different positions of the permanent magnet 6 and, therefore, the signal respectively output by the Hall sensors 1 and 2 in the corresponding positions also differs. The two Hall sensors 1 and 2 are preferably operated in differential circuits in order to suppress noise fields that uniformly act on the two Hall sensors 1 and 2 in a disturbing fashion.

According to FIG. 2, the integrated circuit 3 contains one Hall sensor 10. A permanent magnet 8 is rigidly or displaceably arranged on an axis 9 located perpendicular to the sensor surface. Being rigidly or displaceably arranged thereon dependent on the application. The displacement of the permanent magnet 8 occurs along the axis 7 or, respectively, 9, as was also the case given the permanent magnet 6 of the exemplary embodiment of FIG. 1. A displacement of the permanent magnet 8 or the permanent magnet 6 can thereby occur either with the direct action of force on the permanent magnet given a loose connection between the permanent magnet 8 or the permanent magnet 6 and the respective axis 9 or 7, or by transmitting force via the axis 9 or 7 given a fixed connection thereto.

Compared to FIG. 2, the exemplary embodiment of FIG. 3 is modified to such effect that an annular permanent magnet 11 is arranged on an axis 12 that extends parallel to the sensor surface, being secured to the axis 12 or being rotatable relative thereto. The annular permanent magnet 11 comprises a gap 13.

Just like the entire interior surrounded by the annular magnet 11, the gap 13 is filled up with non-magnetic material 14, for example plastic. A bore for application onto the axis 12 is provided roughly in the center of the ring in the non-magnetic material 14. The two poles of the annular magnet 11 are thereby arranged such that they reside opposite one another in the gap 13. When the permanent magnet 11 is turned given a loose connection or when the axis 12 is turned given a fixed connection, the permanent magnet 11 assumes positions in which polarity and strength of the acting magnetic field differ and, therefore, a signal having different polarity and strength is generated in the Hall sensor 10. For example, the occurring magnetic field is approximately equal to zero in the proximity of the seam between the two poles, whereas it has a maximum value at the poles themselves having the corresponding polarity.

In addition to the aforementioned advantages such as high electrical insulation, low expense and insensitivity to external influences, circuit arrangements and apparatus constructed in accordance with the present invention are also distinguished by a high adaptability to the respective utilization, as presented in the exemplary embodiments.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. The combination of a circuit arrangement and an apparatus for non-contacting reference value prescription of an integrated circuit of the circuit arrangement which is enveloped with non-magnetic material, the function of said circuit arrangement being controlled by at least one control signal, said combination comprising:
   at least one Hall sensor completely encapsulated within said non-magnetic material and electrically connected to said integrated circuit, said Hall sensor generating said at least one control signal; and
   a permanent magnet mounted for movement adjacent and with respect to said Hall sensor.

2. The combination of claim 1, wherein:
   said permanent magnet is mounted on an axis parallel to and is movable parallel to said at least one Hall sensor.

3. The combination of claim 1, wherein:
   said permanent magnet is mounted on an axis and is movable on said axis perpendicular to said at least one Hall sensor.

4. The combination of claim 1, wherein:
   said permanent magnet is an annular permanent magnet mounted for rotation about an axis and comprises a non-magnetic peripheral gap.

5. The combination of claim 1, wherein:
   a plurality of said Hall sensors is provided and enveloped within said non-magnetic material and electrically connected to said integrated circuit, each of said Hall sensors operable to generate a respective control signal.

6. The combination of a circuit arrangement including an integrated circuit and an envelope of non-magnetic material encasing said integrated circuit and electrical contacts extending through said non-magnetic envelope, and apparatus for non-contacting reference value prescription for said integrated circuit, the function of said circuit arrangement being controlled by at least one control signal, said combination comprising:
   a Hall sensor mounted within and fully enveloped by said envelope and electrically connected to said integrated circuit, said Hall sensor generating said at least one control signal; and
   a permanent magnet mounted for movement adjacent said Hall sensor.

* * * * *